United States Patent [19]

Higginbotham et al.

[11] 4,006,433

[45] Feb. 1, 1977

[54] BIAS/ERASE OSCILLATOR

[75] Inventors: Alan Frank Higginbotham; Kenneth Layton Jeffries, both of Austin, Tex.

[73] Assignee: International Business Machines Corporation, Armonk, N.Y.

[22] Filed: Mar. 17, 1975

[21] Appl. No.: 558,576

[52] U.S. Cl. .......................... 331/117 R; 331/168
[51] Int. Cl.² .................................. H03B 5/12
[58] Field of Search .......... 331/115, 117, 132, 168, 331/108 D

[56] References Cited

UNITED STATES PATENTS

| | | | |
|---|---|---|---|
| 2,745,009 | 5/1956 | Moulon | 331/115 |
| 3,391,351 | 7/1968 | Trent | 331/115 |
| 3,464,029 | 8/1969 | Kovalevski | 331/114 |
| 3,649,929 | 3/1972 | Thompson | 331/117 |
| 3,806,828 | 3/1974 | Johnson | 331/117 |

OTHER PUBLICATIONS

Electronic Engineer, W. G. Jung, p. 85, Sept. 1970.
Electronics, Jan. 4, 1963, R. Stapelfeldt, 2 pages.

*Primary Examiner*—John Kominski
*Attorney, Agent, or Firm*—James H. Barksdale, Jr.

[57] ABSTRACT

A low distortion sinusoidal oscillator made up of a two transistor negative resistance element combined with an LC tank for generating bias and erase signals for battery powered magnetic media recording apparatus.

5 Claims, 3 Drawing Figures

BIAS/ERASE OSCILLATOR

BACKGROUND OF THE INVENTION

1. Field of Invention

This invention relates generally to circuits for facilitating magnetic reading, writing and erasing. More specifically, this invention relates to providing bias and erase signals which are independent of power supply fluctuations.

2. Description of the Prior Art

Representative of the closest known prior art patents are U.S. Pat. Nos. 2,810,073; 3,038,036; 3,201,713; 3,305,795; 3,346,821; 3,354,270; and 3,424,871. These patents were developed during a novelty search. Of these U.S. Pat. Nos. 2,810,073 and 3,354,270 are considered the closest in that sinusoidal outputs are generated. The first basically deals with output amplitude stabilization which is accomplished through regulating the power supply voltage. With the subject invention, the circuit is made insensitive to the supply voltage. The second discloses a push/pull circuit configuration rather than a negative resistance oscillator. In addition, the IBM Model 271 Recorder utilizes a soundhead to form a part of an LC tank circuit, but a separate stable reference voltage is not used.

When a low distortion sinusoidal bias and erase oscillator is to be provided for use in portable or miniature battery operated magnetic media recorders, a number of problems are encountered. In addition to low distortion, the amplitude and frequency of the oscillator must be insensitive to battery voltage fluctuations, the required battery drain must be low, and the number of circuit components must be low and small in size. These problems are overcome with the oscillator circuit of this invention.

SUMMARY OF THE INVENTION

An oscillator circuit is provided for obtaining low distortion signals for bias and erase. The circuit is made up primarily of two sections. One of the sections is a frequency determining LC tank. Low distortion oscillation is produced with a low Q tank, and supply current is low relative to the tank current. The other is an AC coupled negative resistance element.

The LC tank is made up of a first inductor, and a second inductor which is the erase winding. The tank also has a series combination of first and second capacitors. The negative resistance element is formed by a differential pair of first and second transistors. This pair of transistors is DC biased to a reference voltage through a first resistor, with a capacitor providing decoupling. A second resistor provides a load for the reference voltage. The base of the first transistor is biased by a third resistor. The DC current through the first and second transistors is adjusted by a fourth resistor, while fifth and sixth resistors make the current through the fourth resistor split nearly evenly through the transistors.

DESCRIPTION OF THE PREFERRED EMBODIMENT

Figure 1:
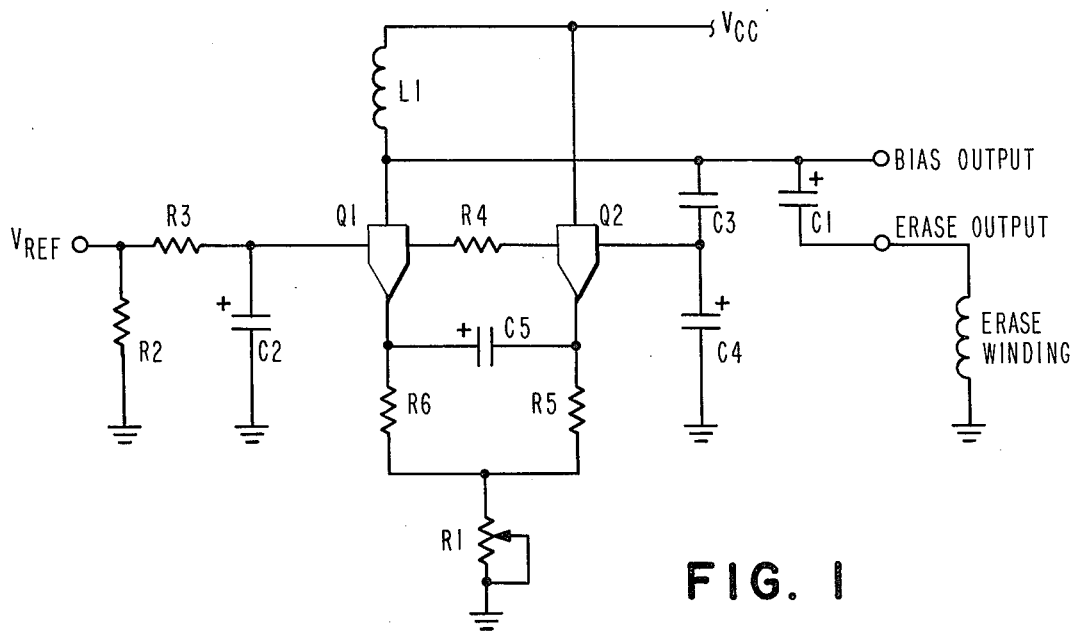
FIG. 1 illustrates the overall oscillator circuit of this invention.

Referring first to FIG. 1 there is shown the overall circuit diagram for the bias/erase oscillator of this invention. Low distortion sinusoidal oscillations are effected by combining an LC tank with a two transistor negative resistance element. Low distortion is provided even though the Q of the LC tank is low. The frequency of oscillation is determined by the LC tank, thereby making it insensitive to supply voltage fluctuations. The oscillation amplitude is determined by a separate stable reference voltage, and is also insensitive to supply voltage fluctuations. Low battery drain is obtained by keeping the emitter and base voltage excursions of the transistors to a minimum. The circuit uses the erase winding itself as part of the LC tank in order to eliminate an additional driver. The erase current is determined directly by the oscillation amplitude and shares all of the stability advantages of the oscillator.

Figure 2:
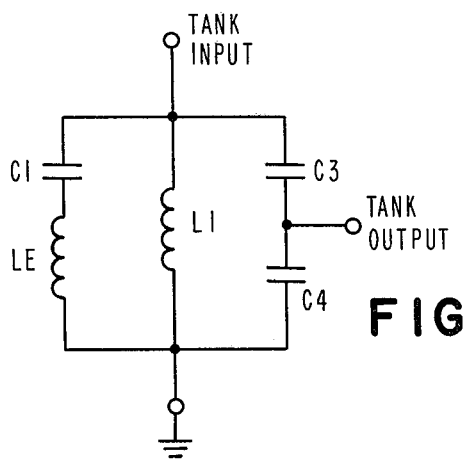
FIG. 2 shows an AC equivalent of the frequency determining LC tank section of the circuit shown in FIG. 1.

Referring next to FIG. 2 there is shown the AC equivalent of the LC tank section of FIG. 1. This tank is comprised of a first inductor L1 in parallel with an erase winding LE which is in turn in parallel with a series combination of capacitors C3 and C4. Capacitor C1 is in series with erase winding or inductor LE and is used to prevent DC current from entering the erase winding.

Figure 3:
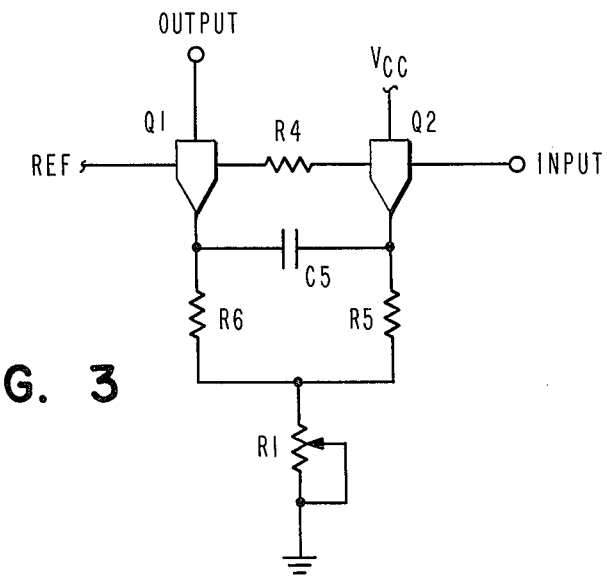
FIG. 3 illustrates the AC coupled negative resistance element portion of the circuit shown in FIG. 1.

The tank input is driven from the collector of transistor Q1 (FIG. 1) which is DC biased to the supply Vcc through inductor L1. The output from the tank is derived from between capacitors C3 and C4 which form a capacitive divider. The tank output is applied to the base of transistor Q2 which is the input to the negative resistance element shown in FIG. 3.

The negative resistance element is formed by the differential pair of transistors Q1 and Q2. The pair is DC biased to a reference voltage Vref through resistor R3 (FIG. 1) with capacitor C2 providing decoupling. Resistor R2 basically is for providing a load for the reference voltage Vref.

The two bases of the transistors Q1 and Q2 are biased closely together by resistor R4. Transistors Q1 and Q2 are conventional NPN transistors. Resistor R4 is representative of a resistance between C2+ and Q1 on one side, and C4+ and Q2 on the other. The DC current through transistors Q1 and Q2 is adjusted by variable resistor R1, while resistors R5 and R6 make the current through resistor R1 split approximately equally through the two transistors Q1 and Q2.

Since resistors R5 and R6 reduce the DC gain of the differential pair of transistors Q1 and Q2, capacitor C5 is included to allow the pair to have a maximum AC gain regardless of DC bias.

The capacitively divided tank voltage is used to drive the negative resistance element in order that emitter voltage excursions will be relatively small and thereby maintain nearly constant current through resistor R1.

Since the input to the pair (the base of transistor Q2) is connected to the output (the collector of Q1) through capacitor C3, the input and output can be considered as being the same AC node. When the voltage at the base of transistor Q2 rises, the output current decreases. Therefore, the transistor pair Q1 and Q2, taken as one element, has a negative resistance characteristic.

The amplitude of oscillation will stabilize at the point where the energy added to the tank by the negative resistance element is just equal to the tank losses. The peak-to-peak tank voltage may exceed the supply voltage being limited eventually by saturation of transistor Q1.

During normal operation, the circuit will cause relatively low distortion during oscillation, and will not clip.

From the above, an AC coupled negative resistance element is used, a low distortion oscillation is produced with a low Q tank, the supply current is low relative to the tank current, a two terminal erase winding with no DC erase current present is utilized in conjunction with a capacitive voltage divider as frequency determining element and sensitivity to minor transistor mismatch is negligible.

In summary, an oscillator circuit is provided for obtaining a low distortion signal for bias and erase. The circuit is made up primarily of two sections. One of the sections is a frequency determining LC tank. Low distortion oscillation is produced with a low Q tank having a capacitive voltage divider, and supply current is low relative to the tank current. The other is an AC coupled negative resistance element.

The LC tank is made up of a first inductor, and a second inductor which is the erase winding. The tank also has a series combination of first and second capacitors. The negative resistance element is formed by a differential pair of first and second transistors. This pair of transistors is DC biased to a reference voltage through a first resistor, with a capacitor providing decoupling. A second resistor provides a load for the reference voltage. The base of the first transistor is biased by a third resistor. The DC current through the first and second transistors is adjusted by a fourth resistor, while fifth and sixth resistors make the current through the fourth resistor split nearly evenly through the transistors.

While the invention has been shown and described with reference to a particular embodiment, it will be understood by those skilled in the art that various changes in form and detail may be made without departing from the spirit and scope of the invention.

What is claimed is:

1. An oscillator for providing low distortion sinusoidal signals for bias and erase in a battery operated magnetic recording apparatus, said oscillator comprising:
   a. tank means for determining oscillation frequency, said tank means including an inductance comprising an erase winding, and a capacitive voltage divider comprising a combination of first and second capacitors connected in series with said inductance, said tank means having an output derived from between said first and second capacitors; and
   b. a differential pair of first and second transistors with said output of said tank means connected to the base of said first transistor, and an input to said tank means connected to the collector of said second transistor from between said first and second capacitors, and said inductance.

2. An oscillator according to claim 1 wherein the emitter of said first transistor is connected to the emitter of said second transistor through a third capacitor for allowing said first and second transistors to have a maximum AC gain regardless of DC bias.

3. An oscillator according to claim 1 wherein said tank means includes an inductance means connected to the collector of said second transistor for DC biasing the collector of said second transistor to a supply voltage.

4. An oscillator according to claim 3 including a first resistance connected to the base of said second transistor for biasing said second transistor to a reference voltage, and a second resistance connected to the bases of said first and second transistors for biasing said first transistor.

5. An oscillator according to claim 4 including variable resistance means for adjusting current through said first and second transistors, with one end of said variable resistance means being connected to ground and the other end being connected to the emitters of said first and second transistors through third and fourth resistances for splitting current through said variable resistance means approximately equally through said first and second transistors.

* * * * *